United States Patent [19]
Stark et al.

[11] Patent Number: 5,825,209
[45] Date of Patent: Oct. 20, 1998

[54] QUADRATURE PHASE DETECTOR

[75] Inventors: Donald C. Stark, Palo Alto; Wayne S. Richardson, Cupertino, both of Calif.

[73] Assignee: Rambus Inc., Mountain View, Calif.

[21] Appl. No.: 807,642

[22] Filed: Feb. 27, 1997

[51] Int. Cl.$^6$ .................................................. H03K 5/26
[52] U.S. Cl. ...................................... 327/3; 327/7
[58] Field of Search .................... 327/2, 3, 7, 10, 327/238, 244, 246, 254, 355–357, 359

[56] References Cited

U.S. PATENT DOCUMENTS

| | | | |
|---|---|---|---|
| 3,617,855 | 11/1971 | Hisatsu | 330/69 |
| 3,675,139 | 7/1972 | Guest | 329/305 |
| 3,771,063 | 11/1973 | Barrett | 327/7 |
| 3,842,211 | 10/1974 | Metro | 331/176 |
| 3,863,080 | 1/1975 | Steckler | 327/9 |
| 3,922,602 | 11/1975 | Lunquist | 327/3 |
| 4,117,410 | 9/1978 | Bender | 329/326 |
| 4,156,851 | 5/1979 | Winters | 327/235 |
| 4,178,554 | 12/1979 | Sase et al. | 327/3 |
| 4,285,006 | 8/1981 | Kurahashi et al. | 358/25 |
| 4,291,274 | 9/1981 | Suzuki et al. | 327/12 |
| 4,364,082 | 12/1982 | Tonomura et al. | 358/28 |
| 4,506,175 | 3/1985 | Reitmeier et al. | 327/12 |
| 4,520,321 | 5/1985 | Nakatsugawa et al. | 327/12 |
| 4,547,685 | 10/1985 | Wong | 327/55 |
| 4,623,805 | 11/1986 | Flora et al. | 327/152 |
| 4,635,097 | 1/1987 | Tatami | 358/13 |
| 4,721,904 | 1/1988 | Ozaki et al. | 324/83 R |
| 4,751,469 | 6/1988 | Nakagawa et al. | 327/7 |
| 4,814,648 | 3/1989 | Hynecek | 327/563 |
| 4,868,512 | 9/1989 | Bridgman | 327/12 |
| 4,870,303 | 9/1989 | McGinn | 327/2 |
| 4,893,094 | 1/1990 | Herold et al. | 331/1 A |
| 4,904,948 | 2/1990 | Asami | 327/12 |
| 4,929,916 | 5/1990 | Fukuda | 331/1 A |
| 4,937,476 | 6/1990 | Bazes | 330/253 |
| 4,958,133 | 9/1990 | Bazes | 330/253 |
| 4,963,817 | 10/1990 | Kohiyama et al. | 324/83 D |

(List continued on next page.)

FOREIGN PATENT DOCUMENTS

| | | |
|---|---|---|
| 0 490 690 A1 | 6/1992 | European Pat. Off. . |
| 0 521 215 A1 | 1/1993 | European Pat. Off. . |
| 55-035516 | 3/1980 | Japan . |
| 59-191906 | 10/1984 | Japan . |
| 2 140 993 | 12/1984 | United Kingdom . |

OTHER PUBLICATIONS

Barrow, Jeff, Craven Hilton, & Frances Lucas, "Eliminate Oscillator From a Loop", *Electronic Design*, Apr. 27, 1989, pp. 107–108.

Enam, S. Khursheed & Asad A. Abidi, "NMOS IC's for Clock and Data Regeneration in Gigabit–per–Second Optical–Fiber Recievers", *IEEE Journal of Solid State Circuits*, Dec. 1992, vol. 12, pp. 1763–1774.

Sontag, Jeff & Robert Leonowich, "A Monolithic CMOS 10MHz DPLL for Burst–Mode Data Retiming", 1990 IEEE International Solid–State Circuit Conference Digest of Technical Papers, 37th ISSCC, 5 pages.

*Primary Examiner*—Tuan T. Lam
*Attorney, Agent, or Firm*—Blakely, Sokoloff, Taylor & Zafman, LLP

[57] ABSTRACT

A quadrature phase detector includes a first load and a current source circuit. A first differential circuit and a second differential circuit coupled to the first load. In response to a first input signal, a first switching circuit couples the current source to the first differential circuit to form a first differential amplifier. The first switching circuit also couples the current source to the second differential circuit to form a second differential amplifier. The second differential amplifier is cross-coupled to the first differential amplifier. The first and second differential amplifiers are coupled to receive a differential second input signal, wherein the first and second input signals have a substantially different signal swing. A second switching circuit couples the current source to a second load in response to the complement of the first input signal. The cross-coupled first and second differential amplifiers provide a differential output signal corresponding to a quadrature phase error between the first and differential second input signals.

21 Claims, 2 Drawing Sheets

U.S. PATENT DOCUMENTS

| | | | |
|---|---|---|---|
| 5,095,233 | 3/1992 | Ashby et al. | 327/149 |
| 5,121,010 | 6/1992 | Hoshizaki et al. | 331/1 A |
| 5,128,554 | 7/1992 | Hoshizaki | 327/147 |
| 5,148,113 | 9/1992 | Wight et al. | 327/3 |
| 5,164,838 | 11/1992 | Okuda | 358/326 |
| 5,179,303 | 1/1993 | Searles et al. | 327/277 |
| 5,187,448 | 2/1993 | Brooks et al. | 330/258 |
| 5,220,294 | 6/1993 | Ichikawa | 331/17 |
| 5,223,755 | 6/1993 | Richley | 327/158 |
| 5,248,946 | 9/1993 | Murakami et al. | 330/253 |
| 5,252,865 | 10/1993 | Davenport et al. | 327/3 |
| 5,253,042 | 10/1993 | Yasuda | 358/19 |
| 5,253,187 | 10/1993 | Kaneko et al. | 364/560 |
| 5,309,047 | 5/1994 | Tiede et al. | 327/52 |
| 5,309,162 | 5/1994 | Uematsu et al. | 342/372 |
| 5,351,000 | 9/1994 | Farwell | 324/76.77 |
| 5,362,995 | 11/1994 | Kubo | 327/65 |
| 5,394,024 | 2/1995 | Buckenmaier et al. | 327/160 |
| 5,400,085 | 3/1995 | Fujiwara et al. | 248/624 |
| 5,422,529 | 6/1995 | Lee | 327/536 |
| 5,422,918 | 6/1995 | Vartti et al. | 375/371 |
| 5,432,480 | 7/1995 | Popescu | 331/11 |
| 5,440,274 | 8/1995 | Bayer | 331/1 A |
| 5,614,855 | 3/1997 | Lee et al. | 327/158 |

QUADRATURE PHASE DETECTOR

FIELD OF THE INVENTION

This invention relates to the field of phase detection circuits. In particular, this invention is drawn a phase detector for detecting the phase difference between two input signals having different voltage swing characteristics while substantially minimizing phase detection errors due to parasitic capacitance.

BACKGROUND OF THE INVENTION

Phase detection circuits are typically used in computer systems and other electronic systems for detecting the phase difference between two input signals. For example, one application for phase detection circuitry is a phase locked loop ("PLL").

A phase locked loop typically includes a phase detector and a voltage controlled oscillator (VCO). The phase detector compares two input signals and generates a phase error signal corresponding to the phase difference between the signals. One input is a reference signal. The other input signal is typically the output signal of the VCO. If the two input signals are periodic, then the phase error signal is a periodic signal having a frequency equal to the difference between the frequencies of the input signals.

The phase error signal is typically amplified and filtered and serves as a control signal for the VCO. The control signal is typically used to control the VCO so that the frequency of the output signal of the VCO matches the frequency of the reference signal. Thus the phase detector, amplifiers, and filters act as a feedback loop to control the VCO. Examples of applications for PLLs include tone decoding, frequency multiplication, frequency synthesis, demodulation of amplitude modulated ("AM") and frequency modulated ("FM") signals, pulse synchronization of signals from noisy sources such as magnetic tape, and regeneration of relatively noiseless signals from noisy signals.

Phase detectors measure phase differences in order to control frequency. Because phase corresponds to the integration of frequency this typically introduces a 90 degree phase shift in the feedback loop. Due to this phase shift some detectors are designed to provide a phase error signal corresponding to the departure from a quadrature phase relationship between the input signals. In this case, the phase error is referred to as quadrature phase error.

One type of phase detector for detecting quadrature phase error is an exclusive-OR gate logic circuit. The exclusive-OR gate logic circuit indicates the quadrature phase error by providing an average output voltage proportional to the quadrature phase error between two input signals.

One disadvantage of the exclusive-OR gate type phase detector is that the input signals typically must have substantially similar voltage swing characteristics. If the input signals have substantially different voltage swings, the average output voltage of the exclusive-OR gate may not properly reflect the quadrature phase error.

Another disadvantage associated with the exclusive-OR gate type phase detector is inaccuracy in detecting the quadrature phase error. One contributor to the phase detection errors is parasitic capacitance. Due to the unpredictable nature of parasitic capacitance, compensation for phase detection error arising from parasitic capacitance can prove difficult particularly over a wide range of frequencies.

SUMMARY AND OBJECTS OF THE INVENTION

In view of limitations of known systems and methods, one of the objectives of the present invention is to provide a phase detector that accurately detects the phase difference between two input signals having different voltage swing characteristics.

Another object of the present invention is to provide a phase detector that substantially minimizes the error in phase detection introduced by parasitic capacitance.

A further object of the present invention is to provide a phase detector for detecting the phase difference between a full voltage swing periodic signal and a low voltage swing quasi-differential or fully differential periodic signal, and for providing compensation for phase detection errors arising from parasitic capacitance such that substantially accurate measurement of the phase difference of the two signals can be obtained.

The quadrature phase detector includes a first load and a current source circuit. The phase detector further comprises a first differential circuit and a second differential circuit coupled to the first load. In response to first input signal, a first switching circuit couples the current source to the first differential circuit to form a first differential amplifier. The first switching circuit also couples the current source to the second differential circuit to form a second differential amplifier. The second differential amplifier is cross-coupled to the first differential amplifier. The first and second differential amplifiers are coupled to receive a differential second input signal, wherein the first and second input signals have a substantially different signal swing. A second switching circuit couples the current source to a second load in response to the complement of the first input signal. The cross-coupled first and second differential amplifiers provide a differential output signal corresponding to a quadrature phase error between the first and differential second input signals wherein the differential output signal is substantially independent of parasitic capacitance associated with each of the first and second differential circuits.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
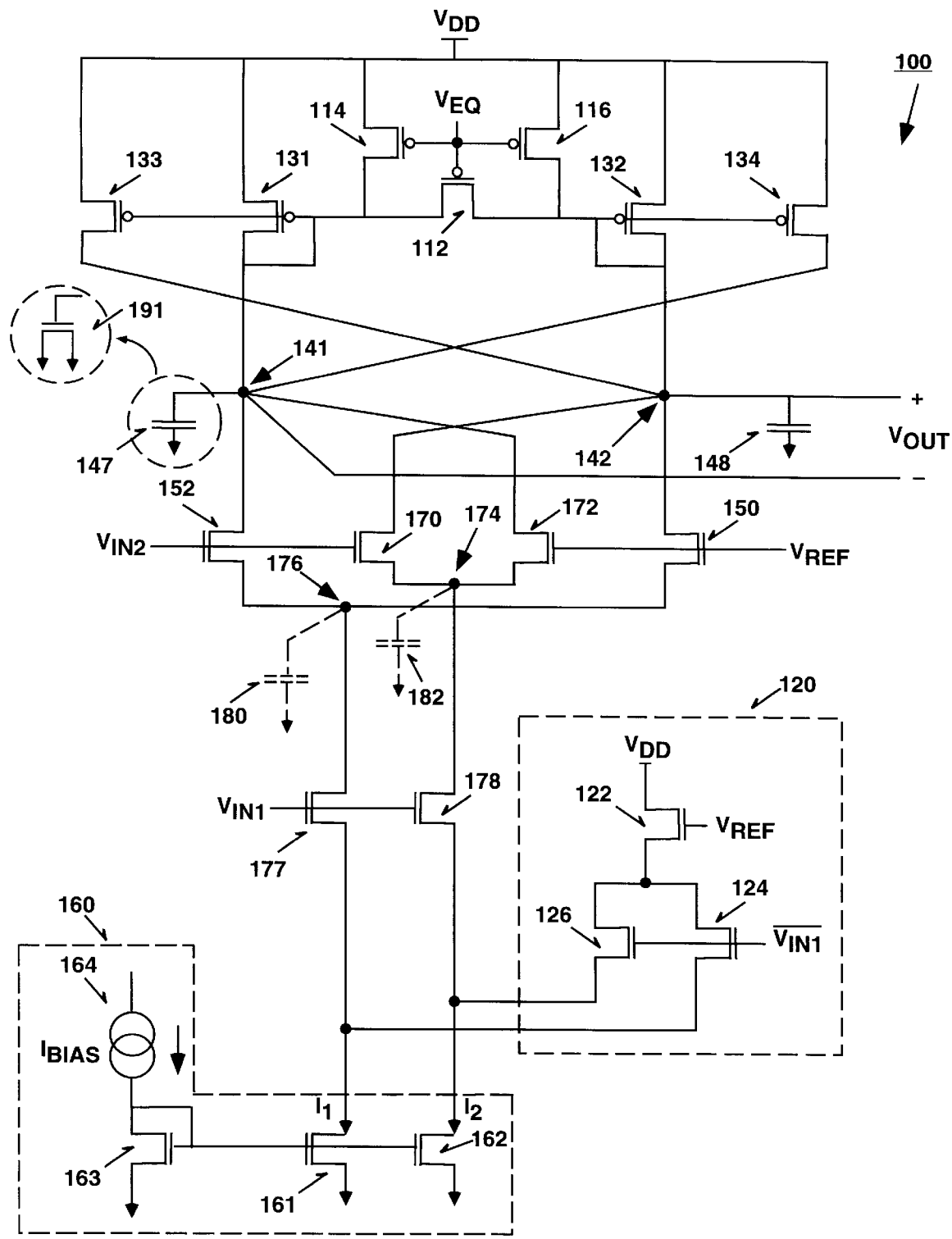
FIG. 1 illustrates one embodiment of a quadrature phase detector.

FIG. 1 illustrates one embodiment of a quadrature phase detector 100. Phase detector 100 detects the quadrature phase error (i.e., departure from 90 degree phase difference) between two input signals having different voltage swing characteristics. In particular phase detector 100 compares the phase of a first input signal, $V_{IN1}$ with that of a differential second signal provided by $V_{IN2}$ and $V_{REF}$. Output nodes 141 and 142 provide a differential quadrature phase error signal, $V_{OUT}$, which varies in accordance with the quadrature phase error between the first and second input signals.

The quadrature phase detector of FIG. 1 substantially minimizes the effects of parasitic capacitance by cross-coupling differential amplifiers. Although the parasitic capacitance contributed by each differential amplifier is unknown, the differential amplifiers are substantially identical in electrical characteristics so that they are associated with approximately the same parasitic capacitance. The contributions of the parasitic capacitances cancel each other out due to the cross-coupling of the differential amplifiers. The current source for one of the differential amplifiers is selected to be a fraction of the magnitude of the current source for the other differential amplifier. Given that the parasitic capacitance is substantially independent of the magnitude of the current sources, this helps to minimize the effects of parasitic capacitance with only a small reduction in differential sensitivity as will be described below.

In the embodiment illustrated in FIG. 1, phase detector 100 includes P-channel metal oxide semiconductor field effect transistors (MOSFETs) 131, 132, 133, 134. Transistors 131, 132, 133, and 134 form a first load for the phase detector. Transistors 150, 152, 170, and 172 are N-channel MOSFETs so that transistors 131–134 and 150, 152, 170, and 172 are coupled in a complementary metal oxide semiconductor ("CMOS") configuration. In an alternative embodiment transistors 131–134 are N-channel MOSFETs and transistors 150, 152, 170, and 172, are P-channel MOSFETs. In other embodiments, other devices, such as bipolar transistors, may be used.

The drains of transistors 131 and 134 are connected to node 141 and the drain of transistors 132 and 133 are connected to node 142. The gate and drain of transistor 131 are connected so that transistor 131 is a diode-coupled transistor. Transistor 132 is similarly diode-coupled. In addition, the gate of transistor 133 is connected to the gate of transistor 131, and the gate of transistor 134 is connected to the gate of transistor 132.

Transistors 131 and 132 serve as positive differential load resistance between output nodes 141 and 142. Transistors 133 and 134, however, serve as a negative differential load resistance between output nodes 141 and 142. Given that the gates of transistors 131 and 133 are connected, transistor 133 mirrors the current through transistor 131. Thus transistors 131 and 133 form a first current mirror for the phase detector load. Transistors 132 and 134 similarly form a second current mirror.

The current provided to node 141 through transistor 131 is mirrored to node 142 through transistor 133. Similarly, the current provided to node 142 through transistor 132 is mirrored to node 141 through transistor 134. Nodes 141 and 142 receives substantially the same amount of current so that no differential current exists between the output nodes. Transistors 131–134 thus provide a high differential mode impedance because the negative differential load resistance generated by transistors 133 and 134 cancels the positive differential load resistance generated by transistors 131 and 132. Diode coupled transistors 131 and 132 serve to provide a low common mode impedance between power supply ($V_{DD}$) and output nodes 141 and 142. The phase detector load formed by transistors 131–134 is therefore a high differential, low common mode impedance between the output nodes 141 and 142.

Alternatively, other types of load circuits can be used in phase detector 100 between the power supply $V_{DD}$ and nodes 141–142. For example, the load circuit formed by transistors 131–134 can be another high differential mode, low common mode impedance load circuit.

The first load is coupled to a first differential circuit formed by transistors 150 and 152. The first load is also coupled to a second differential circuit formed by transistors 170 and 172. The second differential circuit is cross-coupled to the first differential circuit.

The drain of transistor 150 is coupled to output node 142. The drain of transistor 152 is coupled to output node 141. The sources of transistors 150 and 152 are coupled to form node 176. The drain of transistor 170 is coupled to node 142. The drain of transistor 172 is coupled to node 141. The sources of transistors 170 and 172 are coupled to form node 174.

Transistors 177 and 178 form a switching circuit for coupling current source circuitry 160 to the first and second differential circuits in accordance with input signal $V_{IN1}$.

Transistor 177 is coupled between node 176 and current source circuitry 160. Transistor 178 is coupled between node 174 and current source circuitry 160. Current source circuitry 160 includes a first current source for providing a first current $I_1$ through transistor 177 and a second current source for providing a second current $I_2$ through transistor 178. A first current mirror formed by transistors 161 and 163 provides $I_1$. A second current mirror formed by transistors 162 and 163 provides $I_2$. The $I_1$ and $I_2$ currents are controlled by an $I_{BIAS}$ current.

Current source circuitry 160 may also be referred to as current sink circuitry because currents $I_1$ and $I_2$ are drawn through a load connected to a more positive supply (i.e., $V_{DD}$). The term "current source" is used throughout this description in lieu of "current sink."

The magnitude of the $I_2$ current is smaller than that of the $I_1$ current. For one embodiment, the magnitude of the $I_2$ current is in a range of 30% to 50% of the $I_1$ current. For alternative embodiments, the value of the $I_2$ current can be larger or smaller than 30% to 50% of the $I_1$ current.

Transistor 177 effectively serves as a switch to couple the first current source to the first differential circuit and the first load. When coupled, the first current source, first load, and first differential circuit form a first differential amplifier. Similarly, transistor 178 couples the second current source, first load, and second differential circuit to form a second differential amplifier. The switching circuit formed by transistors 177 and 178 is controlled by first input signal, $V_{IN1}$. First input signal $V_{IN1}$ establishes the phase detection period.

Transistor 122 forms a second load. Transistor 122 is biased by $V_{BIAS}$. In one embodiment, $V_{BIAS}$ is $V_{REF}$. In an alternative embodiment, $V_{BIAS}$ is approximately the same as the average voltage (i.e., d.c. value) of the differential second input signal.

Transistors 124 and 126 form a switching circuit for coupling the second load to current source circuitry 160. In particular, transistor 124 couples the second load to the first current source. Similarly, transistor 126 couples the second load to the second current source. Transistors 124 and 126 are controlled by the complement of $V_{IN1}$.

Phase detector 100 also includes equalization circuitry 110 to initialize the quadrature phase error signal before starting a detection cycle. Equalization circuitry 110 includes equalization transistors 112, 114, and 116. Transistor 112 is coupled between output nodes 141 and 142. Transistor 114 is coupled between $V_{DD}$ and node 141. Transistor 116 is coupled between $V_{DD}$ and node 142. The gates of transistors 112, 114, and 116 are coupled to receive an equalization signal, $V_{\overline{EQ}}$.

In one embodiment, phase detector 100 also includes capacitors 147 and 148. Capacitor 147 is coupled between node 141 and signal ground. Capacitor 148 is coupled between node 142 and signal ground. In one embodiment signal ground is a d.c. ground. In another embodiment, signal ground is $V_{DD}$.

In one embodiment, capacitors 147 and 148 are implemented using MOSFETs such as 191. Transistor 191 is an n-channel MOSFET. The drain and source of transistor 191 are coupled to signal ground. The capacitance is provided by a gate oxide layer of the MOSFET. Thus, for example, capacitor 147 can be realized by coupling the gate of transistor 191 to node 141. Capacitor 148 can similarly be realized by using another MOSFET.

Figure 2:
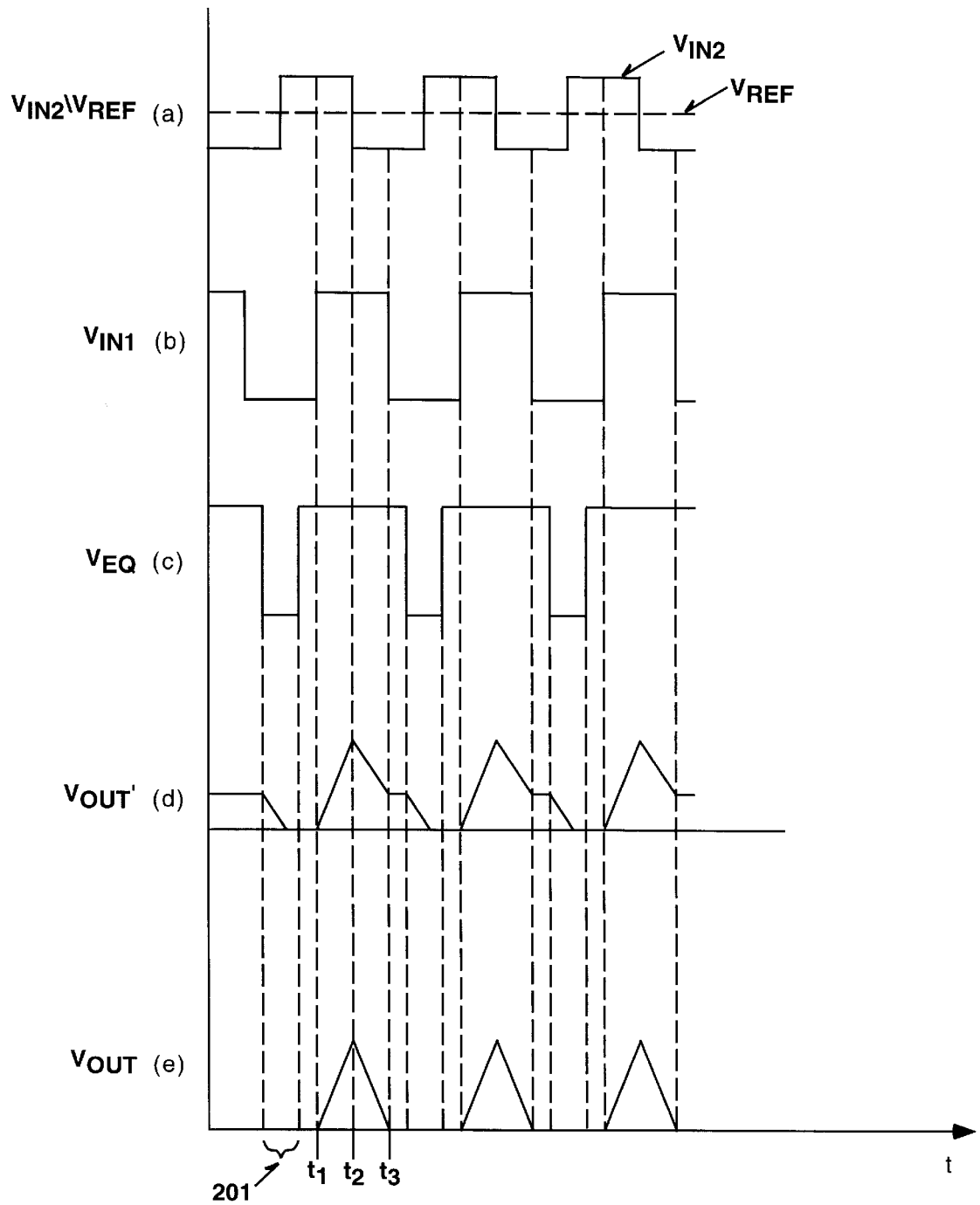
FIGS. 2(a)–(e) illustrates output waveforms of the quadrature phase error detector for a given set of input signals.

The operation of quadrature phase detector 100 is described with respect to FIG. 2. The equalization signal, $V_{EQ}$, is represented by waveform (c). When $V_{EQ}$ is low, $V_{OUT}$ is substantially zero independent of the value of the first and second input signals as illustrated during time 201 of waveform (e). In one embodiment, the phase detector is equalized before the start of every detection cycle.

In response to $V_{\overline{EQ}}$, transistor 112 couples nodes 141 and 142 together so that the potential difference between nodes 141 and 142 (i.e., $V_{OUT}$) is substantially zero. Transistors 114 and 116 couple nodes 141 and 142, respectively, to $V_{DD}$ in response to $V_{\overline{EQ}}$. Thus nodes 141 and 142 are shorted together to ensure a substantially zero $V_{OUT}$ in response to the equalization signal. In addition nodes 141 and 142 are shorted or precharged to $V_{DD}$. In one embodiment, the equalization signal is a CMOS compatible logic signal.

Precharging nodes 141 and 142 to $V_{DD}$ provides for a greater voltage margin during operation. The quadrature phase detector effectively integrates the difference between I1 and I2 when generating $V_{OUT}$. The integration process tends to cause node voltages at nodes 141 and 142 to decrease. For proper operation transistors 150, 152, 170, and 172 should operate in saturation mode. If the voltage at nodes 141 and 142 decreases enough, transistors 150, 152, 170, and 172 will enter into a linear mode of operation and the quadrature phase detector will no longer accurately reflect the quadrature phase error. The equalization circuitry formed by transistors 112, 114, and 116 permits the quadrature phase detector to integrate for a longer period of time by precharging nodes 141 and 142 to $V_{DD}$.

The first input signal, $V_{IN1}$, controls the start of each detection cycle. In the embodiment illustrated, a detection cycle is initiated whenever the voltage level of the $V_{IN1}$ signal rises sufficiently to activate transistors 177 and 178. In one embodiment $V_{IN1}$ is a CMOS compatible logic signal exhibiting a full CMOS voltage swing.

The second input signal is a differential signal. In the embodiment illustrated, the differential second input signal is determined by the difference between $V_{IN2}$ and $V_{REF}$. The differential second input signal is therefore referred to as $V_{IN2}/V_{REF}$.

In one embodiment, the $V_{IN2}$ signal is a small voltage swing signal that oscillates substantially symmetrically around the $V_{REF}$ reference voltage. The $V_{REF}$ signal illustrated in FIG. 2 is a d.c. reference voltage. In other words, the $V_{IN2}$ and $V_{REF}$ signals are not complementary to each other.

Alternatively, the quadrature phase detector can be used with a small swing, fully differential signal that swings between a $V_{high}$ voltage and a $V_{low}$ voltage. In this case, the $V_{REF}$ signal is complementary to the $V_{IN2}$ signal. In other words, when the gate of transistor 152 receives the $V_{high}$ voltage, the gate of transistor 150 receives the $V_{low}$ voltage.

Ideally, if the first and second input signals are 90 degrees out of phase, the phase detector should indicate zero phase error. The quadrature phase error detector measures the error by integrating the differential second input signal during a detection cycle controlled by the first input signal. If the signals are 90 degrees out of phase, the cumulative phase error measured during a single detection cycle will be zero.

Referring to FIG. 2, the initiation of a detection cycle is controlled by $V_{IN1}$ and occurs at time $t_1$ as illustrated in waveform (b). In one embodiment, $V_{IN2}$ is a square wave oscillating about d.c. bias $V_{REF}$ as illustrated in waveform (a). Although $V_{IN2}$ is illustrated as a square wave, $V_{IN2}$ can generally be any other periodic waveform including sine, triangle, sawtooth, or other waveform. The integral of ($V_{IN2}-V_{REF}$) results in a triangular waveform. The triangular waveform has a positive slope when $V_{IN2}>V_{REF}$ (e.g., between time $t_1$ and $t_2$). Conversely, $V_{OUT}$ has a negative slope when $V_{IN2}<V_{REF}$ (e.g., between time t2 and t3).

If the quadrature phase error is initially zero, then the quadrature phase error should be zero at the end of a detection cycle only if the $V_{IN1}$ and $V_{IN2}\backslash V_{REF}$ signals are 90 degrees out of phase. In other words the quadrature phase error signal varies during the detection cycle, but ideally returns to the initial value at the beginning of the detection cycle (e.g., see waveform (e) at time t3) if the two input signals are 90 degrees out of phase with each other.

One significant source of errors in phase detection, however, arises from parasitic capacitance. Parasitic capacitance due to transistors 150, 152, and 177 is modeled as capacitor 182. Parasitic capacitance due to transistors 170, 172, and 178 is modeled as capacitor 180. If capacitors 180 and 182 are not matched, then the unmatched error currents may cause undesirable errors in the output of the quadrature phase detector as illustrated in FIG. 2. Waveform (d) (i.e., $V_{OUT}'$), for example illustrates the effects of error currents due to an unmatched parasitic capacitor 182.

In one embodiment transistors 150, 152, 170, and 172 are chosen to have substantially the same electrical characteristics. Similarly, transistors 177 and 178 are chosen to have substantially the same electrical characteristics. This helps to ensure that parasitic capacitors 180 and 182 have substantially the same capacitance.

Assuming transistors 150, 152, 170, and 172 are matched in electrical characteristics and that transistors 177 and 178 are matched in electrical characteristics, errors in the quadrature phase error detection signal due to parasitic capacitance are substantially reduced by canceling the error introduced by one parasitic capacitance with errors introduced by a matching parasitic capacitance. The result is an output signal, $V_{OUT}$ as illustrated in waveform (e).

The first and second differential circuits (i.e., differential amplifiers) are cross-coupled, thus the output of the second differential amplifier tends to negate or cancel the output of the first differential amplifier. The first and second differential amplifiers are driven by different current sources. As stated above, in one embodiment, $I_2$ is approximately 30% to 50% of $I_1$. Thus the second differential amplifier only cancels a fraction of the output of the first differential amplifier. $V_{OUT}$ is reduced accordingly by 30%–50%.

The error currents introduced by the parasitic capacitances are independent of the first and second current sources. Instead, the error currents are a function of the magnitude of the parasitic capacitances. By choosing circuit components such that parasitic capacitances are matched for the first and second cross-coupled differential amplifiers, the error due to parasitic capacitance can be substantially eliminated. The error current injected by capacitor 182 is canceled by the error injected by capacitor 180 due to the cross coupling of the first and second differential amplifiers. In other words, differential mode sensitivity is exchanged for greater accuracy in quadrature phase error measurement.

The gate of transistors 177 and 178 receives first input signal $V_{IN1}$. The gates of transistors 150, 152, 170, and 172 are used to sense the differential second input signal $V_{IN2}$/$V_{REF}$. The gates of transistors 150 and 172 receive $V_{REF}$. The gates of transistor 152 and 170 receives $V_{IN2}$. The first input signal, $V_{IN1}$, controls the detection cycle.

Referring to FIG. 2, transistor 177 is turned on by $V_{IN1}$ at time t1. Transistor 152 is conducting because $V_{IN2}$ is greater than $V_{REF}$. The voltage at node 176 does not change immediately, however, due to parasitic capacitor 180. Parasitic capacitor 180 provides a portion (i.e., $I_{ERR1}$) of the current $I_1$ conducted through transistor 177. Thus the current conducted by transistor 152 is less than $I_1$ by the amount $I_{ERR1}$. As a result, capacitor 147 is discharged at an inadequate rate thus introducing an error potential at node 141.

The cross-coupling of the differential amplifiers tends to have a net effect of canceling the error potential. At time t1, transistors 170 and 178 are similarly conducting to discharge capacitor 148 at node 142. The voltage at node 174 does not change immediately, however, due to parasitic capacitor 182. Parasitic capacitor 182 provides a portion (i.e., $I_{ERR2}$) of the current $I_2$ conducted through transistor 178. Thus the current conducted by transistor 170 is less than $I_2$ by the amount $I_{ERR2}$. As a result, capacitor 148 is discharged at an inadequate rate thus introducing an error potential at node 142. If the components are matched such that the capacitance of the parasitic capacitors 180 and 182 are substantially the same, then $I_{ERR1}$ is substantially the same as $I_{ERR2}$ (i.e., $I_{ERR1} \approx I_{ERR2}$). Thus the error potential introduced at node 142 is substantially the same as the error potential introduced at node 141. Given that the $V_{OUT}$ is a differential signal these error potentials cancel each other out. Thus no net differential voltage due to parasitic capacitors 180 and 182 is developed at the output $V_{OUT}$ at time t1.

At time t2, transistor 150 becomes conductive because $V_{REF}$ is greater than $V_{IN2}$. As was the case at time t1, capacitor 148 is discharged at an inadequate rate due to the presence of capacitor 180, thus an error potential is developed at node 142. Capacitor 147 is also discharged at an inadequate rate due to the presence of capacitor 182, thus an error potential is developed at node 141. If parasitic capacitors 180 and 182 have substantially the same capacitance, the error potential introduced at node 141 is substantially the same as the error potential introduced at node 142. Given that the $V_{OUT}$ is a differential signal these error potentials cancel each other out. Thus no net differential voltage due to parasitic capacitors 180 and 182 is developed at the output $V_{OUT}$ at time t2.

At time t3, $V_{IN1}$ is de-asserted thus turning transistors 177 and 178 off. Prior to t3 (i.e., t3⁻) transistors 172 and 150 were on. The voltage at node 174 will rise to $V_{REF}$ less the turn-on threshold voltage ($V_t$) of transistor 172, thus further discharging capacitor 147. The voltage at node 176 will rise to $V_{REF}$ less the $V_t$ of transistor 150 thus further discharging capacitor 148. Due to the differential nature of $V_{OUT}$, no net error results from the additional discharging because of the equality of parasitic capacitors 180 and 182.

Another source of error is introduced at times t1, t2, and t3 due to the inequality of currents $I_1$ and $I_2$. The voltages at nodes 174 and 176 are not the same when transistors 177 and 178 are turned off because of the inequality of $I_1$ and $I_2$. More charge must be transferred from node 142 than from node 141 thus causing a small differential error to occur across the output $V_{OUT}$ because nodes 141 and 142 were not equally discharged. This error can be reduced by ensuring that capacitors 147 and 148 have capacitances substantially larger than the capacitance of parasitic capacitors 180 and 182. As the ratio of the capacitance at node 141 to the capacitance at node 174, for example, increases, this differential error tends to decrease.

Without capacitors 147 and 148, some parasitic capacitance would be present at nodes 141 and 142 due to diffusion capacitance of the p-channel load circuitry, the equalization circuitry, and the differential circuitry. Diffusion capacitance is difficult to predict, however, and the use of capacitors 147 and 148 which have substantially larger capacitance values than parasitic capacitors 180 and 182 also tends to minimize the effects of variances in diffusion capacitance due to manufacturing tolerances.

In one embodiment, capacitors 147 and 148 are selected to have values which tend to minimize the effects of parasitic capacitors 180 and 182. In particular, capacitors 147 and 148 are chosen to have capacitance values substantially greater than the capacitance of parasitic capacitors 180 and 182.

Phase detector 100 further includes a second load circuit 120. Current source circuitry 160 is continuously pulling current through transistors 177 and 178 when $V_{IN1}$ is high. When $V_{IN1}$ is low, transistors 177 and 178 are turned off. The second load circuit, however, is controlled by the complement of $V_{IN1}$ (i.e., $\overline{V_{IN1}}$). Transistor 122 is coupled to $V_{DD}$ and biased by $V_{REF}$ to provide the second load. In alternative embodiments, transistor 122 is biased by another source such that transistor 122 is biased at approximately the average level of the differential second input signal (i.e., $\overline{(V_{IN2}+V_{REF/2})}$).

Switching transistors 124 and 126 are coupled to the first and second current sources of current source circuitry 160. Given that switching transistors 177 and 178 are controlled by $V_{IN1}$, the second load circuit is coupled to current source circuitry 160 only when $V_{IN1}$ is low. Thus transistors 177 and 178 are switched off when transistors 124 and 126 are on. Similarly, transistors 124 and 126 are switched off when transistors 177 and 178 are switched on. Thus the state of $V_{IN1}$ controls whether current source circuitry 160 is coupled to $V_{DD}$ through the first load (transistors 131–134) or the secondary load (transistor 122). Switching between loads to maintain $I_1$ and $I_2$ tends to eliminate voltage fluctuations at the drains of transistors 161 and 162 that may otherwise introduce errors in integration. For example, stabilization of the voltages at the drains of transistors 161 and 162 tends to minimize errors that may be induced due to parasitic capacitances at the sources of transistors 177 and 178, respectively.

The $V_{OUT}$ output of phase detector 100 can also be connected to a comparator to generate a binary quadrature phase error output. Alternatively, other circuits can be used to generate the binary quadrature phase error output.

The quadrature phase detector described above includes first and second load circuits. A first differential circuit couples the first load to a current source. A second differential circuit is cross-coupled to the first differential amplifier to substantially eliminate phase detection errors due to parasitic capacitance. The current source circuitry is coupled to the first load through a first pair of switching transistors. The current source circuitry is coupled to a second load through a second pair of switching transistors. One of the first and second loads is selected in accordance with a first input signal, $V_{IN1}$. A differential signal, $V_{IN2}$/$V_{REF}$ is applied to the first and second differential circuits. The first and second differential circuits provide a quadrature phase error output signal, corresponding to a departure from 90 degree phase difference between the first and differential second input signals, wherein the quadrature phase error output signal is substantially independent of the individual parasitic capacitances associated with each of the first and second differential circuits.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus for detecting quadrature phase error, comprising:
   a first load;
   a second load;
   cross-coupled first and second differential circuits, the cross-coupled differential circuits coupled to the first load;
   a current source circuit;
   a first switching circuit;
   a second switching circuit, wherein the first and second switching circuits operate to couple the current source circuit to a selected one of the cross-coupled differential circuits and the second load in accordance with a first input signal and a complement of the first input signal, respectively;
   wherein the cross-coupled differential circuits receive a differential second input signal, wherein the first and second input signals have a different signal swing, wherein the cross-coupled first and second differential circuits provide a quadrature phase error signal at a first and second output representing a quadrature phase error between the first and second input signals, wherein the quadrature phase error signal is substantially independent of parasitic capacitance associated with the first and second differential circuits.

2. The apparatus of claim 1 wherein the first differential circuit further comprises a first transistor and a second transistor, wherein the first and second transistors have substantially the same electrical characteristics.

3. The apparatus of claim 1 wherein the second differential circuit further comprises a first transistor and a second transistor, wherein the first and second transistors have substantially the same electrical characteristics.

4. The apparatus of claim 1 wherein the first differential circuit further comprises a first transistor and a second transistor, wherein the second differential circuit further comprises a third transistor and a fourth transistor, wherein the first, second, third, and fourth transistors have substantially the same electrical characteristics.

5. The apparatus of claim 1 wherein the current source circuit further comprises a first current source and a second current source.

6. The apparatus of claim 5 wherein the first switching circuit comprises:
   a first transistor for coupling the first differential circuit to the first current source in accordance with the first input signal; and
   a second transistor for coupling the second differential circuit to the second current source in accordance with the first input signal, wherein the first and second transistors have substantially the same electrical characteristics.

7. The apparatus of claim 5 wherein the second switching circuit comprises:
   a first transistor for coupling the second load to the first current source in accordance with the complement of the first input signal; and
   a second transistor for coupling the second load to the second current source in accordance with the complement of the first input signal, wherein the first and second transistors have substantially the same electrical characteristics.

8. The apparatus of claim 1 further comprising:
   a precharging circuit, wherein the precharging circuit precharges the first output and the second output of the cross-coupled differential circuits to a predetermined first potential in response to an equalization signal.

9. The apparatus of claim 1 wherein the first input signal has complementary metal oxide semiconductor (CMOS) compatible logic levels.

10. The apparatus of claim 1 wherein the differential second input signal is a full differential signal.

11. The apparatus of claim 1 wherein the differential second input signal is a quasi-differential signal.

12. The apparatus of claim 1 wherein the first load comprises:
   a first current mirror comprising:
      a diode-coupled first transistor coupled to the first output of the cross-coupled differential circuits;
      a second transistor coupled to mirror the current through the first transistor to the second output of the cross-coupled differential circuits;
   a second current mirror comprising:
      a diode-coupled third transistor coupled to the second output of the cross-coupled differential circuits;
      a fourth transistor coupled to mirror the current through the third transistor to the first output of the cross-coupled differential circuits.

13. The apparatus of claim 12 wherein the first, second, third, and fourth transistors are P type transistors.

14. The apparatus of claim 12 wherein the first, second, third, and fourth transistors are N-type transistors.

15. The apparatus of claim 1 wherein the second load comprises an N-type transistor.

16. The apparatus of claim 1 further comprising:
   a first capacitance coupled between the first output of the first and second differential circuits and a signal ground;
   a second capacitance coupled between the second output of the first and second differential circuits and the signal ground, wherein the first and second capacitances are substantially greater than a parasitic capacitance associated with each of the first and second differential circuits.

17. The apparatus of claim 1 further comprising equalization circuitry coupled to the first and second outputs, wherein the equalization circuitry forces the quadrature phase error signal to a predetermined value in response to an equalization signal.

18. An apparatus for detecting quadrature phase error, comprising:
   a first load;
   cross-coupled first and second differential circuits, the first and second differential circuits coupled to the first load;
   a current source circuit providing a first current and a second current;

a first switching circuit coupling the first current to the first differential circuit and the second current to the second differential circuit in response to a first input signal, the cross-coupled differential circuits coupled to receive a differential second input signal;

a second load; and a second switching circuit coupling the first and second currents to the second load in response to a complement of the first input signal, the cross-coupled differential circuits providing a quadrature phase error signal representing a quadrature phase error between the first and second input signals, wherein the quadrature phase error signal is substantially independent of parasitic capacitance associated with the first and second differential circuits.

19. The apparatus of claim 18 wherein the first and second input signals have a different signal swing.

20. The apparatus of claim 18 wherein the first and second currents have substantially different magnitudes.

21. The apparatus of claim 18 further comprising equalization circuitry coupled to the cross-coupled differential circuits, wherein the equalization circuitry forces the quadrature phase error signal to a predetermined value in response to an equalization signal.

* * * * *